United States Patent
Fujimoto

(10) Patent No.: US 9,412,856 B2
(45) Date of Patent: Aug. 9, 2016

(54) SEMICONDUCTOR DEVICE

(71) Applicant: KABUSHIKI KAISHA TOSHIBA, Tokyo (JP)

(72) Inventor: Hidetoshi Fujimoto, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/474,028

(22) Filed: Aug. 29, 2014

(65) Prior Publication Data

US 2015/0263154 A1    Sep. 17, 2015

(30) Foreign Application Priority Data

Mar. 14, 2014   (JP) ................. 2014-052734

(51) Int. Cl.
| | |
|---|---|
| *H01L 29/778* | (2006.01) |
| *H01L 29/20* | (2006.01) |
| *H01L 29/10* | (2006.01) |
| *H01L 21/02* | (2006.01) |

(52) U.S. Cl.
CPC ........ *H01L 29/7786* (2013.01); *H01L 29/1066* (2013.01); *H01L 21/02241* (2013.01); *H01L 29/2003* (2013.01)

(58) Field of Classification Search
CPC ............ H01L 29/7786; H01L 29/1066; H01L 29/2003; H01L 21/02241
See application file for complete search history.

(56) References Cited

U.S. PATENT DOCUMENTS

| | | |
|---|---|---|
| 8,164,117 B2 | 4/2012 | Sato |
| 2012/0068227 A1 | 3/2012 | Hikita et al. |
| 2012/0313106 A1 | 12/2012 | He |

FOREIGN PATENT DOCUMENTS

| | | | |
|---|---|---|---|
| JP | 2010103425 A | | 5/2010 |
| JP | 2010199620 A | | 9/2010 |
| JP | 2012124327 A | * | 6/2012 |

OTHER PUBLICATIONS

Taiwan Office Action dated Jan. 21, 2016, filed in Taiwan counterpart Application No. 103118878, 8 pages (with translation).

* cited by examiner

*Primary Examiner* — Julio J Maldonado
*Assistant Examiner* — Farun Lu
(74) *Attorney, Agent, or Firm* — Patterson & Sheridan, LLP

(57) ABSTRACT

A semiconductor device includes a first and second nitride semiconductor layer. The second nitride semiconductor layer has a band gap larger the first nitride semiconductor layer. Source and drain electrodes are formed spaced from each other on the second nitride semiconductor layer. A third nitride semiconductor layer is formed on the second nitride semiconductor layer between the source and drain electrodes. A gate electrode is formed on the third nitride semiconductor layer. The third nitride semiconductor layer comprises at least two first layers and at least one a second layer which has a lower p-type dopant concentration than the first layer. The second layer also has a band gap larger than the first layer. The lowermost layer and the uppermost layer in the third nitride semiconductor layer stack are the first layers.

20 Claims, 1 Drawing Sheet

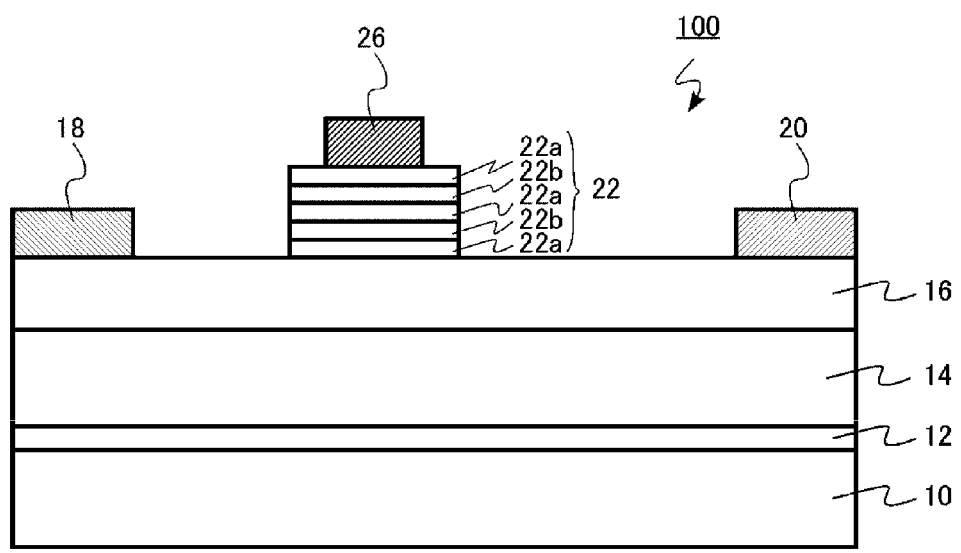

SEMICONDUCTOR DEVICE

CROSS-REFERENCE TO RELATED APPLICATION

This application is based upon and claims the benefit of priority from Japanese Patent Application No. 2014-052374, filed Mar. 14, 2014, the entire contents of which are incorporated herein by reference.

FIELD

The disclosure relates to a semiconductor device.

BACKGROUND

A semiconductor element such as a switching element or a diode is used in a circuit such as a switching power source or an inverter. These semiconductor elements are required to have high breakdown voltage and low ON resistance. In general, there exists a tradeoff based on a material of the semiconductor element between the breakdown voltage and the ON resistance.

The lowering of the ON resistance of a semiconductor element is believed to be approaching the limit of silicon, which is a primary material of semiconductor device elements. Thus, to further lower the ON resistance, it is necessary to use elements other than silicon. With the use of a nitride semiconductor such as GaN or AlGaN or a wide band gap semiconductor such as a silicon carbide (SiC) as a material of a switching element, the tradeoff relationship can be improved, thus enabling a lowering of the ON resistance of a semiconductor device.

A High Electron Mobility Transistor (HEMT) which uses the AlGaN/GaN heterojunction structure is a nitride semiconductor with a low ON resistance, for example. The HEMT achieves the low ON resistance through the high mobility of electrons at a heterojunction interface channel and a high electron concentration generated by polarization.

Since electrons are generated by polarization in the HEMT a high concentration of electrons exist below a gate electrode. Accordingly, a HEMT is usually a normally-ON element (that is, the device channel is conductive unless a voltage is applied to the gate electrode) and the threshold voltage of the HEMT is generally negative. However, in view of a safe operation, there has been a demand for a normally-OFF element where a threshold voltage is positive. Further, it is desirable to increase a gate-on threshold voltage for increasing an ON current in the normally-OFF element.

DESCRIPTION OF THE DRAWINGS

FIG. 1 is a schematic cross-sectional view illustrating a semiconductor device according to an embodiment.

DETAILED DESCRIPTION

An embodiment of the present disclosure provides a semiconductor device having an increased gate-on threshold voltage.

A semiconductor device includes a first and second nitride semiconductor layer. The second nitride semiconductor layer has a band gap larger the first nitride semiconductor layer. Source and drain electrodes are spaced from each other on the second nitride semiconductor layer. A third nitride semiconductor layer is on the second nitride semiconductor layer between the source and drain electrodes. A gate electrode is formed on the third nitride semiconductor layer between the source and drain electrodes. The third nitride semiconductor layer comprises a plurality of stacked layers which includes at least two high-dopant concentration layers and at least one a low-dopant concentration layer. The low-dopant concentration has a lower p-type dopant concentration than the high-dopant concentration layer. The low-dopant concentration also has a band gap larger than the high-dopant concentration layer. The lowermost layer (the layer nearest the second nitride semiconductor layer) and the uppermost layer (the layer nearest the gate electrode) in the third nitride semiconductor layer stack are high-dopant concentration layers.

In general, according to one embodiment, a semiconductor device includes: a first nitride semiconductor layer; a second nitride semiconductor layer that is formed on the first nitride semiconductor layer and has a band gap larger than a band gap of the first nitride semiconductor layer; a source electrode that is formed on the second nitride semiconductor layer; a drain electrode that is formed on the second nitride semiconductor layer; a third nitride semiconductor layer that is formed on the second nitride semiconductor layer between the source electrode and the drain electrode, and is formed by alternately laminating a high-dopant concentration layer which contains a p-type dopant and a low-dopant concentration layer which has lower p-type dopant concentration than the high-dopant concentration layer and a band gap larger than a band gap of the high-dopant concentration layer, the lowermost layer and the uppermost layer being the high-dopant concentration layer; and a gate electrode that is formed on the third nitride semiconductor layer.

In the disclosure, identical or substantially similar elements are given the same reference symbols, and repeated explanation of these parts may be omitted when appropriate.

In this disclosure, "nitride semiconductor" includes a GaN-based semiconductor, for example. "GaN-based semiconductor" is a general term for a semiconductor material which includes at least one of gallium nitride (GaN), aluminum nitride (AlN), and indium nitride (InN), or mixtures of these materials.

In the disclosure, "undoped" means that a dopant is not introduced intentionally to the relevant material or layer.

The semiconductor device according to the embodiment includes: a first nitride semiconductor layer; a second nitride semiconductor layer which is formed on the first nitride semiconductor layer and has a band gap larger than that of the first nitride semiconductor layer; a source electrode which is formed on the second nitride semiconductor layer; a drain electrode which is formed on the second nitride semiconductor layer; a third nitride semiconductor layer which is formed on the second nitride semiconductor layer between the source electrode and the drain electrode, and is formed by alternately laminating a high-dopant concentration layer which contains a p-type dopant and a low-dopant concentration layer which has lower p-type dopant concentration than the high-dopant concentration layer and a band gap larger than that of the high-dopant concentration layer, the lowermost layer and the uppermost layer being the high-dopant concentration layer; and a gate electrode which is formed on the third nitride semiconductor layer.

FIG. 1 is a schematic cross-sectional view illustrating a semiconductor device according to an example embodiment. The semiconductor device according to the example embodiment is an HEMT including a GaN-based semiconductor.

As illustrated in FIG. 1, the semiconductor device (HEMT) 100 includes: a substrate 10; a buffer layer 12; a channel layer (first nitride semiconductor layer) 14; a barrier layer (second nitride semiconductor layer) 16; a source electrode 18; a drain electrode 20; a cap layer (third nitride semiconductor layer) 22; and a gate electrode 26.

The substrate 10 is made of silicon (Si), for example. Sapphire ($Al_2O_3$) or silicon carbide (SiC) can be also used in place of silicon, for example.

The buffer layer 12 is formed on the substrate 10. The buffer layer 12 has a function of alleviating a lattice mismatch between the substrate 10 and the channel layer 14. The buffer layer 12 has the multilayer structure formed of aluminum gallium nitride ($Al_wGa_{1-w}N$ (0<W<1)), for example.

The channel layer 14 is formed on the buffer layer 12. The channel layer 14 is made of undoped $Al_zGa_{1-z}N$ (0≤Z<1), for example. To be more specific, the channel layer 14 is made of undoped GaN, for example. A film thickness of the channel layer 14 is between 0.5 μm and 3 μm, inclusive, for example.

The barrier layer 16 is formed on the channel layer 14. A band gap of the barrier layer 16 is larger than a band gap of the channel layer 14. The barrier layer 16 is made of undoped $Al_uGa_{1-u}N$ (0<U≤1, where U>Z), for example. To be more specific, the barrier layer 16 is made of undoped $Al_{0.20}Ga_{0.80}N$, for example. A film thickness of the barrier layer 16 is between 20 nm and 50 nm, inclusive, for example.

A heterojunction interface is formed between the channel layer 14 and the barrier layer 16. When the HEMT 100 is turned on, a two-dimensional electron gas (2DEG) is formed at the hetero-junction interface, and the gas becomes a carrier.

The source electrode 18 and the drain electrode 20 are formed on the barrier layer 16. The source electrode 18 and the drain electrode 20 are respectively formed of a metal electrode, for example. The metal electrode is an electrode which is mainly made of aluminum (Al), for example. It is desirable that an ohmic contact be formed between the source electrode 18 and the barrier layer 16 as well as between the drain electrode 20 and the barrier layer 16. A distance between the source electrode 18 and the drain electrode 20 is approximately 18 μm, for example.

The cap layer 22 is formed on the barrier layer 16 between the source electrode 18 and the drain electrode 20. The cap layer 22 has a function of increasing a potential of the channel layer 14 thus increasing a threshold value of the HEMT 100.

The cap layer 22 has the structure where a high-dopant concentration layer 22a and a low-dopant concentration layer 22b are alternately laminated. The lowermost layer and the uppermost layer of the cap layer 22 are formed of the high-dopant concentration layer 22a.

Although the case where three high-dopant concentration layers 22a and two low-dopant concentration layers 22b are laminated to each other is illustrated in FIG. 1 as an example, the number of layers of the high-dopant concentration layer 22a is not limited to three layers, and the number of layers of the low-dopant concentration layers 22b is not limited to two layers. Furthermore, the composition, a p-type dopant concentration, and a film thickness of the high-dopant concentration layer 22a may differ for each layer—that is, each layer 22a need not be the same as each other layer 22a, but may vary in composition, dopant concentration, and/or thickness. In the same manner, the composition, a p-type dopant concentration and a film thickness of the low-dopant concentration layer 22b may differ for each layer—that is, each layer 22b need not be the same as each other layer 22b, but may vary in composition, dopant concentration, and/or thickness.

The high-dopant concentration layer 22a contains a p-type dopant. The p-type dopant is Mg (magnesium), for example. From a viewpoint of increasing a threshold value of the HEMT 100, it is desirable that the p-type dopant concentration in the high-dopant concentration layer 22a is $1\times10^{18}$ atoms/cm$^3$ or more.

Further, from a viewpoint of bringing a junction between the cap layer 22 and the gate electrode 26 into an ohmic contact, it is desirable that a p-type dopant concentration in the cap layer 22 become the largest in the high-dopant concentration layer 22a which is the uppermost layer in contact with the gate electrode 26. It is desirable that the p-type dopant concentration in the high-dopant concentration layer 22a which is the uppermost layer be $1\times10^{19}$ atoms/cm$^3$ or more.

The high-dopant concentration layer 22a is made of p-type $Al_xGa_{1-x}N$ (0≤X<1), for example. To be more specific, the high-dopant concentration layer 22a is made of p-type GaN, for example. A film thickness of the high-dopant concentration layer 22a between 1 nm and 10 nm, inclusive, for example. The high-dopant concentration layer 22a is made of a single crystal.

A dopant concentration can be analyzed by SIMS (Secondary Ion Mass Spectrometry), for example.

The low-dopant concentration layer 22b has a lower p-type dopant concentration than the high-dopant concentration layer 22a. Further, the low-dopant concentration layer 22b has a larger band gap than the high-dopant concentration layer 22a.

The low-dopant concentration layer 22b is made of undoped $Al_yGa_{1-y}N$ (0<Y≤1, where Y>X), for example. To be more specific, the low-dopant concentration layer 22b is made of undoped $Al_{0.40}Ga_{0.60}N$, for example. A film thickness of the low-dopant concentration layer 22b between 1 nm and 10 nm, inclusive, for example. The low-dopant concentration layer 22b is made of a single crystal.

The gate electrode 26 is formed on the cap layer 22. The gate electrode 26 is a metal electrode, for example. The metal electrode is an electrode having a laminated structure of platinum (Pt) and gold (Au), for example. It is desirable that an ohmic contact be formed between the gate electrode 26 and the high-dopant concentration layer 22a which forms the uppermost layer.

Next, one example of a method of manufacturing the semiconductor device according to this embodiment is explained.

Firstly, a substrate 10, for example, a Si substrate is prepared. Next, the buffer layer 12 is formed on the Si substrate by an epitaxial growth method, for example.

Next, an undoped GaN layer (which becomes the channel layer 14) and an undoped $Al_{0.20}Ga_{0.80}N$ layer (which becomes the barrier layer 16) are formed on the buffer layer 12 by an epitaxial growth method.

Next, a p-type GaN layer (which forms the high-dopant concentration layer 22a) and an undoped $Al_{0.40}Ga_{0.60}N$ layer (which forms the low-dopant concentration layer 22b) are formed by an epitaxial growth method in an alternating layer stack, so as to form the cap layer 22.

The cap layer 22 is selectively grown on a surface of the barrier layer 16 by forming a patterned insulation film on a surface of the barrier layer 16, for example, before forming the cap layer 22.

Next, the source electrode 18 and the drain electrode 20 are formed on the surface of the barrier layer 16 by forming a metal film on a surface of the barrier layer 16 and by patterning to the metal film. The gate electrode 26 is formed on a surface of the cap layer 22 by forming a metal film on a surface of the cap layer 22 and patterning the metal film.

The semiconductor device 100 illustrated in FIG. 1 is manufactured by the above-mentioned manufacturing method.

Next, the manner of operation and advantageous effects of the semiconductor device 100 according to this example embodiment are explained.

In the HEMT 100, the cap layer 22, which contains the p-type dopant, is present directly below the gate electrode 26 and hence, a potential of the channel layer 14 is increased. Accordingly, the generation of a two-dimensional electron gas is suppressed so that a threshold value of the HEMT 100 is increased as compared to a case where the cap layer 22 is not present. When an energy level at a lower end of a conductive band on a heterojunction interface falls on a higher energy side than a Fermi level, the channel layer 14 is depleted even when a gate voltage is 0 V so that the HEMT 100 is of a normally-off operation type.

To increase an ON current of the HEMT 100, it is desirable to increase a gate-on (threshold) voltage applied to the gate electrode 26 at the time of turning on the HEMT 100. However, when the gate-on voltage is excessively increased at the time of turning on the HEMT 100, a gate leak current, which flows between the source electrode 18 and the gate electrode 26, is increased, for example, so that there exists a possibility that power consumption will be increased or an operation failure will occur.

When a band gap of the cap layer 22 is increased, a forward rising voltage of a pn junction between the barrier layer 16 and the cap layer 22 is increased and hence, a gate-on voltage can be increased as a result.

On the other hand, in the GaN-based semiconductor, the larger the band gap, the lower a p-type dopant activation rate becomes and hence, it is difficult to form a p-type semiconductor. For example, to compare GaN with AlGaN or to compare GaN with AlN, GaN which has a smaller band gap exhibits a higher p-type dopant activation rate. Accordingly, it is difficult for a semiconductor having a large band gap to increase a potential of the channel layer 14 by increasing a p-type dopant concentration.

In this example embodiment, the high-dopant concentration layer 22a having a small band gap and the low-dopant concentration layer 22b having a large band gap are laminated to each other. Due to such a configuration, the high-dopant concentration layer 22a having a high p-type dopant activation rate contributes to the increase of a p-type dopant concentration in the cap layer 22 as a whole. On the other hand, the low-dopant concentration layer 22b having a large band gap contributes to the increase of a band gap of the cap layer 22 as a whole.

Accordingly, it is possible to achieve the nitride semiconductor layer where the cap layer 22 effectively has a large band gap and a high p-type dopant concentration when considered as a whole. Accordingly, it is possible to achieve the HEMT 100 which performs a normally-off operation and has a high gate-on voltage.

A film thickness of the low-dopant concentration layer 22b is desirably from 1 nm or more to 10 nm or less, and is more desirably from 2 nm or more to 6 nm or less.

When the film thickness of the low-dopant concentration layer 22b becomes lower than the above-mentioned range, it is difficult to increase a band gap of the cap layer 22 as a whole. On the other hand, when the film thickness of the low-dopant concentration layer 22b exceeds the above-mentioned range, there exists a possibility that a p-type dopant concentration in the cap layer 22 becomes insufficient as a whole.

A film thickness of the high-dopant concentration layer 22a is desirably from 1 nm or more to 10 nm or less, and is more desirably from 2 nm or more to 6 nm or less.

When the film thickness of the high-dopant concentration layer 22b becomes lower than the above-mentioned range, it is difficult to increase a p-type dopant concentration of the cap layer 22 as a whole. On the other hand, when the film thickness of the high-dopant concentration layer 22b exceeds the above-mentioned range, there exists a possibility that a band gap of the cap layer 22 will become extremely small as a whole.

From a viewpoint of allowing the cap layer 22 to have a characteristic which is acquired by averaging the property of the high-dopant concentration layer 22a and the property of the low-dopant concentration layer 22b, it is desirable that a film thickness of the low-dopant concentration layer 22b and a film thickness of the high-dopant concentration layer 22a each be set to 10 nm or less. Further, from a viewpoint of allowing the cap layer 22 to have a characteristic which is acquired by averaging the property of the high-dopant concentration layer 22a and the property of the low-dopant concentration layer 22b, it is desirable that the cap layer 22 have a superlattice structure.

It is desirable that an average aluminum composition of the cap layer (third nitride semiconductor layer) 22 be lower than an average aluminum composition of the barrier layer (second nitride semiconductor layer) 16. When a band gap of the cap layer 22 becomes larger than a band gap of the barrier layer 16, there is a possibility that an amount of piezo-polarization generated directly below the gate electrode 26 will be increased so that a threshold voltage level of the HEMT 100 is lowered.

The average aluminum composition of the cap layer 22 is obtained by dividing a sum of the products of aluminum compositions and film thicknesses of the respective high-dopant concentration layers 22a and the products of aluminum compositions and film thickness of the respective low-dopant concentration layers 22b by a total, combined film thickness of the cap layer 22.

For example, assuming that a composition of the ith ($1 \le i$) high-dopant concentration layer 22a is expressed as $Al_{Xi}Ga_{1-Xi}N$, where Xi is a respective composition value for the ith high-dopant concentration layer 22a, a film thickness of the ith high-dopant concentration layer 22a is expressed as Tai, a composition of the ith ($1 \le i$) low-dopant concentration layer 22b is expressed as $Al_{Yi}Ga_{1-Yi}N$, where Yi is a respective composition value for the ith low-dopant concentration layer 22b, and a film thickness of the ith low-dopant concentration layer 22b is expressed as Tbi, when the number of layers of the high-dopant concentration layers 22a is n ($1 \le i \le n$), the average aluminum composition of the cap layer 22 is expressed by the following formula.

$$\frac{\sum_{i=1}^{n} Xi \cdot Tai + \sum_{i=1}^{n-1} Yi \cdot Tbi}{\sum_{i=1}^{n} Tai + \sum_{i=1}^{n-1} Tbi} \quad \text{[Formula 1]}$$

Accordingly, assuming that a composition of the barrier layer 16 is expressed by $Al_{u}Ga_{1-u}N$, for example, it is desirable that the following formula be satisfied.

$$\frac{\sum_{i=1}^{n} Xi \cdot Tai + \sum_{i=1}^{n-1} Yi \cdot Tbi}{\sum_{i=1}^{n} Tai + \sum_{i=1}^{n-1} Tbi} < U \quad \text{[Formula 2]}$$

An average aluminum composition of the cap layer 22 can be obtained by analyzing layer composition in a film thickness direction by SIMS. When the cap layer 22 has a superlattice structure, for example, the average aluminum composition of the cap layer 22 can be obtained also by a photoluminescence method.

As has been explained, according to this embodiment, there is provided the HEMT 100 is a normally-off transistor and has a high gate-on (threshold) voltage.

Although the explanation has been made by taking the example case where GaN or AlGaN is used as a material for forming the nitride semiconductor layer, it is also possible to use InGaN, InAlN or InAlGaN, which contains indium (In), for forming the nitride semiconductor layer, for example. Furthermore, AlN can be also used as a material for forming the nitride semiconductor layer.

Although undoped AlGaN is explained as a material for forming the barrier layer as an example, n-type AlGaN can also be used as a material for forming the barrier layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first nitride semiconductor layer;
a second nitride semiconductor layer on the first nitride semiconductor layer and having a band gap larger than a band gap of the first nitride semiconductor layer;
a source electrode and a drain electrode spaced apart from each other in a first direction and directly contacting the second nitride semiconductor layer;
a third nitride semiconductor layer on the second nitride semiconductor layer and between the source and drain electrodes in the first direction; and
a gate electrode on the third nitride semiconductor layer, wherein
the third nitride semiconductor layer comprises a plurality of stacked layers between the second semiconductor layer and the gate electrode in a second direction crossing the first direction, the plurality of stacked layers including at least two first layers and at least one second layer, the at least two first layers having a p-type dopant concentration that is higher than a p-type dopant concentration of the at least one second layer,
the at least one second layer having a band gap that is larger than a band gap of the at least two first layers, and
a first one of the at least two first layers being a layer in the plurality of stacked layers nearest the gate electrode and a second one of the at least two first layers being a layer in the plurality of stacked layers nearest the second nitride semiconductor layer.

2. The semiconductor device according to claim 1, wherein the at least two first layers comprise $Al_xGa_{1-x}N$ ($0 \leq X < 1$), and
the at least one second layer comprises $Al_yGa_{1-y}N$ ($0 < Y \leq 1$ and $X < Y$).

3. The semiconductor device according to claim 2, wherein the first nitride semiconductor layer comprises $Al_zGa_{1-z}N$ ($0 \leq Z < 1$), and
the second nitride semiconductor layer comprises $Al_uGa_{1-u}N$ ($0 < U \leq 1$ and $Z < U$).

4. The semiconductor device according to claim 3, wherein an average aluminum composition of the third nitride semiconductor layer is less than an average aluminum composition of the second nitride semiconductor layer.

5. The semiconductor device according claim 1, wherein a film thickness of the at least one second layer is in a range of 1 nm to 10 nm, inclusive.

6. The semiconductor device according claim 1, wherein a film thickness of each of the at least two first layers is in a range of 1 nm to 10 nm, inclusive.

7. The semiconductor device according to claim 1, wherein a p-type dopant concentration of each of the at least two first layers is $1 \times 10^{18}$ atoms/cm$^3$ or more.

8. The semiconductor device according to claim 1, wherein the second one of the at least two first layers has the highest p-type dopant concentration of any layer in the plurality of stacked layers.

9. The semiconductor device according to claim 1, wherein magnesium is a p-type dopant used in the plurality of stacked layers.

10. A semiconductor device, comprising:
a first semiconductor layer comprising a first nitride semiconductor material;
a second semiconductor layer on the first semiconductor layer and comprising a second nitride semiconductor material, the second nitride semiconductor material having a band gap larger than a band gap of the first nitride semiconductor material;
a source electrode and a drain electrode spaced apart from each other in a first direction and directly contacting the second semiconductor layer;
a gate electrode on the second semiconductor layer;
a plurality of stacked layers between the gate electrode and the second semiconductor layer in a second direction crossing the first direction and between the source and drain electrodes in the first direction, the plurality of stacked layers comprising first layers and second layers, wherein
each of the first layers has a concentration of p-type dopants that is greater than a concentration of p-type dopants of each of the second layers,
each of the second layers has a band gap that is larger than a band gap of each of the first layers,
a first one of the first layers in the plurality of stacked layers contacts the gate electrode, and
a second one of the first layers in the plurality of stacked layers contacts the second semiconductor layer.

11. The semiconductor device of claim 10, wherein each of the first layers has a same thickness.

12. The semiconductor device according to claim 10, wherein the concentration of p-type dopants of at least two of the first layers in the plurality of stacked layers is different.

13. The semiconductor device according to claim 10, wherein
each first layer in the plurality of stacked layers comprises $Al_xGa_{1-x}N$ ($0 \leq X < 1$), and
each second layer in the plurality of stacked layers comprises $Al_yGa_{1-y}N$ ($0 < Y \leq 1$ and $X < Y$).

14. The semiconductor device according to claim 10, wherein
the first semiconductor layer comprises $Al_zGa_{1-z}N$ ($0 \leq Z < 1$), and
the second semiconductor layer comprises $Al_uGa_{1-u}N$ ($0 < U \leq 1$ and $Z < U$).

15. The semiconductor device according to claim 10, wherein each second layer in the plurality of stacked layers is directly contacting two first layers in the plurality of stacked layers.

16. The semiconductor device according to claim 10, wherein an average aluminum composition of the plurality of stacked layers is less than an average aluminum composition of the second semiconductor layer.

17. The semiconductor device according to claim 10, wherein the plurality of stacked layers is a superlattice.

18. A method of manufacturing a semiconductor device, comprising:
   forming a first nitride semiconductor layer comprising $Al_zGa_{1-z}N$ ($0 \leq Z < 1$);
   forming a second nitride semiconductor layer comprising $Al_uGa_{1-u}N$ ($0 < U \leq 1$ and $Z < U$), the second nitride semiconductor layer having a band gap that is larger than a band gap of the first nitride semiconductor layer;
   forming a source and a drain electrode spaced apart from each other in a first direction and directly contacting the second nitride semiconductor layer;
   forming a plurality of stacked layers on the second nitride semiconductor layer, the plurality of stacked layers being between the source and drain electrodes in the first direction and including at least two first layers and at least one second layer, the at least two first layers having a p-type dopant concentration that is higher than a p-type dopant concentration of the at least one second layer, the at least one second layer having a band gap that is larger than a band gap of the at least two first layers; and
   forming a gate electrode on the plurality of stacked layers, the plurality of stacked layers being between the gate electrode and the second nitride semiconductor layer in a second direction crossing the first direction, wherein
   a first one of the at least two first layers is being a layer in the plurality of stacked layers nearest the gate electrode, and
   a second one of the at least two first layers being a layer in the plurality of stacked layers nearest the second nitride semiconductor layer.

19. The method according to claim 18, wherein
the at least two first layers comprise $Al_xGa_{1-x}N$ ($0 \leq X < 1$), and
the at least one second layer comprises $Al_yGa_{1-y}N$ ($0 < Y \leq 1$ and $X < Y$).

20. The method according to claim 18, wherein the plurality of stacked layers is formed by an epitaxial growth method.

* * * * *